United States Patent
Martin

(10) Patent No.: US 10,510,568 B2
(45) Date of Patent: Dec. 17, 2019

(54) CORROSION INHIBITOR INJECTION APPARATUS

(71) Applicant: Kirk Alan Martin, Aptos, CA (US)

(72) Inventor: Kirk Alan Martin, Aptos, CA (US)

(73) Assignee: RKD Engineering Corporation, Scotts Valley, CA (US)

( * ) Notice: Subject to any disclaimer, the term of this patent is extended or adjusted under 35 U.S.C. 154(b) by 11 days.

(21) Appl. No.: 14/887,726

(22) Filed: Oct. 20, 2015

(65) Prior Publication Data

US 2017/0107629 A1   Apr. 20, 2017

(51) Int. Cl.
*C23F 11/04* (2006.01)
*H01L 21/67* (2006.01)

(52) U.S. Cl.
CPC .... *H01L 21/67253* (2013.01); *H01L 21/6708* (2013.01); *H01L 21/67126* (2013.01)

(58) Field of Classification Search
None
See application file for complete search history.

(56) References Cited

U.S. PATENT DOCUMENTS

| | | | | |
|---|---|---|---|---|
| 4,826,556 A * | 5/1989 | Kobayashi | ........ | H01L 21/67126 156/345.18 |
| 5,783,098 A * | 7/1998 | Martin | .............. | H01L 21/67126 156/345.18 |
| 5,855,727 A * | 1/1999 | Martin | .............. | H01L 21/67126 156/345.18 |
| 6,267,820 B1 * | 7/2001 | Chen | .................... | C23C 16/4407 118/715 |
| 2003/0013317 A1 * | 1/2003 | Martin | .............. | H01L 21/30604 438/745 |
| 2011/0220286 A1 * | 9/2011 | Park | ........................ | B01F 5/0057 156/345.11 |
| 2013/0157471 A1 * | 6/2013 | Martin | .............. | H01L 21/67126 438/745 |
| 2017/0107629 A1 * | 4/2017 | Martin | .............. | H01L 21/67126 |

* cited by examiner

*Primary Examiner* — Sylvia Macarthur
(74) *Attorney, Agent, or Firm* — Donald R. Boys; Central Coast Patent Agency, LLC

(57) ABSTRACT

An inhibitor solution injector system for an IC decapsulation apparatus has a source reservoir of inhibitor solution, a fluid injection apparatus connected to the source reservoir by a fluid passage, an injection coupling having a first input passage for inhibitor solution, and a through passage for etchant solution, the input passage intersecting with the through passage, and control circuitry controlling the controlled fluid injection apparatus. The fluid injection apparatus is controlled to draw inhibitor solution from the source reservoir, and to inject inhibitor solution through the input passage into the through passage of the injection coupling.

7 Claims, 8 Drawing Sheets ated chip (IC)
CORROSION INHIBITOR INJECTION APPARATUS

BACKGROUND OF THE INVENTION

1. Field of the Invention

The present invention is in the field of integrated chip (IC) manufacturing and pertains particularly to methods and apparatus for controlling decapsulation of chip packages for IC modification, testing, and quality control (QC) purposes.

2. Discussion of the State of the Art

In the art of integrated circuit (IC) chip manufacturing, there are instances where encapsulated integrated circuits may be decapsulated in part to expose critical bond wires and active surfaces for quality control and maintenance purposes during and post manufacturing. More often, encapsulated chip packages include integrated circuits manufactured using silver, a silver alloy, or other metal interconnecting apparatus. A mold compound typically serves as the encapsulating medium and must be removed from certain areas of the integrated circuit.

In integrated circuit plastic package decapsulating, protection of the device bond wires or traces is critical. In a case of copper bond wires, there are typically nitric and sulfuric acid enchant mixes used in decapsulating at temperatures at or below the ambient temperature. However ICs with silver or silver alloy bond wires are vulnerable to corrosive damage to the wire or trace by way of the decapsulating solution.

In the case of silver or silver alloy interconnects or bond wires, a corrosion inhibitor is required to create a refractory coating on the silver or silver alloy wires. One documented corrosion inhibitor is potassium iodide and iodine in water. This solution reacts to form a free halide creating a protective coating of silver iodide on the wire surface. In this case the preferred etchant is 100% fuming nitric acid. The inhibitor must be added in very low concentrations to prevent diluting reactive acid and to limit water sources that may lead to ionization of the reactive acid solution. The preferred ratio used conventionally for silver is 30 parts 100% fuming nitric acid to 1 part saturated potassium iodide-iodine solution.

A problem with this approach is that the preferred corrosion inhibitor tends to react with the strong acids necessary in the decapsulation process. Therefore what is clearly needed is an apparatus and method for introducing micro amounts of corrosion inhibit to the acid stream dynamically from a decapsulation pump.

BRIEF SUMMARY OF THE INVENTION

In one embodiment of the invention an inhibitor solution injector system for an IC decapsulation apparatus is provided, comprising a source reservoir of inhibitor solution, a fluid injection apparatus connected to the source reservoir by a fluid passage, an injection coupling having a first input passage for inhibitor solution, and a through passage for etchant solution, the input passage intersecting with the through passage, and control circuitry controlling the controlled fluid injection apparatus. The fluid injection apparatus is controlled to draw inhibitor solution from the source reservoir, and to inject inhibitor solution through the input passage into the through passage of the injection coupling.

In one embodiment of the invention the fluid injection apparatus is controlled to inject inhibitor solution at one or more of specific times, in specific quantity or at specific rate, coordinated with measured flow of etchant solution through the through passage. Also in one embodiment the fluid injection apparatus is controlled to inject a specific quantity of inhibitor solution into the through passage at a time when there is no flow of etchant solution through the through passage. Also in one embodiment the fluid injection apparatus comprises a syringe apparatus having a plunger driven by a translator mechanism. Also in one embodiment the translator mechanism is driven by a coupled electric motor controlled by the control circuitry.

In one embodiment the control circuitry further comprises a processor executing software following preprogrammed control data. Also in one embodiment the injection coupling through passage comprises a first bore intersecting a second bore at an obtuse angle, and the input passage intersects the through passage at the intersection of the first bore and the second bore, the input passage forming an equal acute angle with each of the first and the second bores. And in one embodiment the first and the second bore are of a common diameter, and the input passage has a diameter substantially smaller than the bores of the through passage.

In another aspect of the invention a method for controlling injection of inhibitor into etchant solution is provided, comprising the steps of providing a coupling having a through passage for etchant and an input passage for inhibitor intersecting with the through passage, connecting a fluid output port of a fluid injection apparatus to the input passage of the coupling by a fluid conductor, drawing inhibitor solution from a reservoir by the fluid injection apparatus and urging the inhibitor solution into the input passage of the coupling, and controlling the timing and quantity of injection by the fluid injection apparatus by control circuitry.

In one embodiment of the method the fluid injection apparatus is controlled to inject inhibitor solution at one or more of specific times, in specific quantity or at specific rate, coordinated with measured flow of etchant solution through the through passage. Also in one embodiment the fluid injection apparatus is controlled to inject a specific quantity of inhibitor solution into the through passage at a time when there is no flow of etchant solution through the through passage. Also in one embodiment the fluid injection apparatus comprises a syringe apparatus having a plunger driven by a translator mechanism. Also in one embodiment the translator mechanism is driven by a coupled electric motor controlled by the control circuitry.

In one embodiment of the method the control circuitry further comprises a processor executing software following preprogrammed control data. Also in one embodiment the injection coupling through passage comprises a first bore intersecting a second bore at an obtuse angle, and the input passage intersects the through passage at the intersection of the first bore and the second bore, the input passage forming an equal acute angle with each of the first and the second bores. And in one embodiment the first and the second bore are of a common diameter, and the input passage has a diameter substantially smaller than the bores of the through passage.

DETAILED DESCRIPTION OF THE INVENTION

In various embodiments described in enabling detail herein, the inventor provides a unique system that provides dynamic, automated and timed injection of micro amounts of corrosion inhibitor into an acid stream dispensed to encapsulate a portion of a packaged integrated circuit (IC). The present invention is described using the following examples, which may describe more than one relevant embodiment falling within the scope of the invention.

Figure 1:
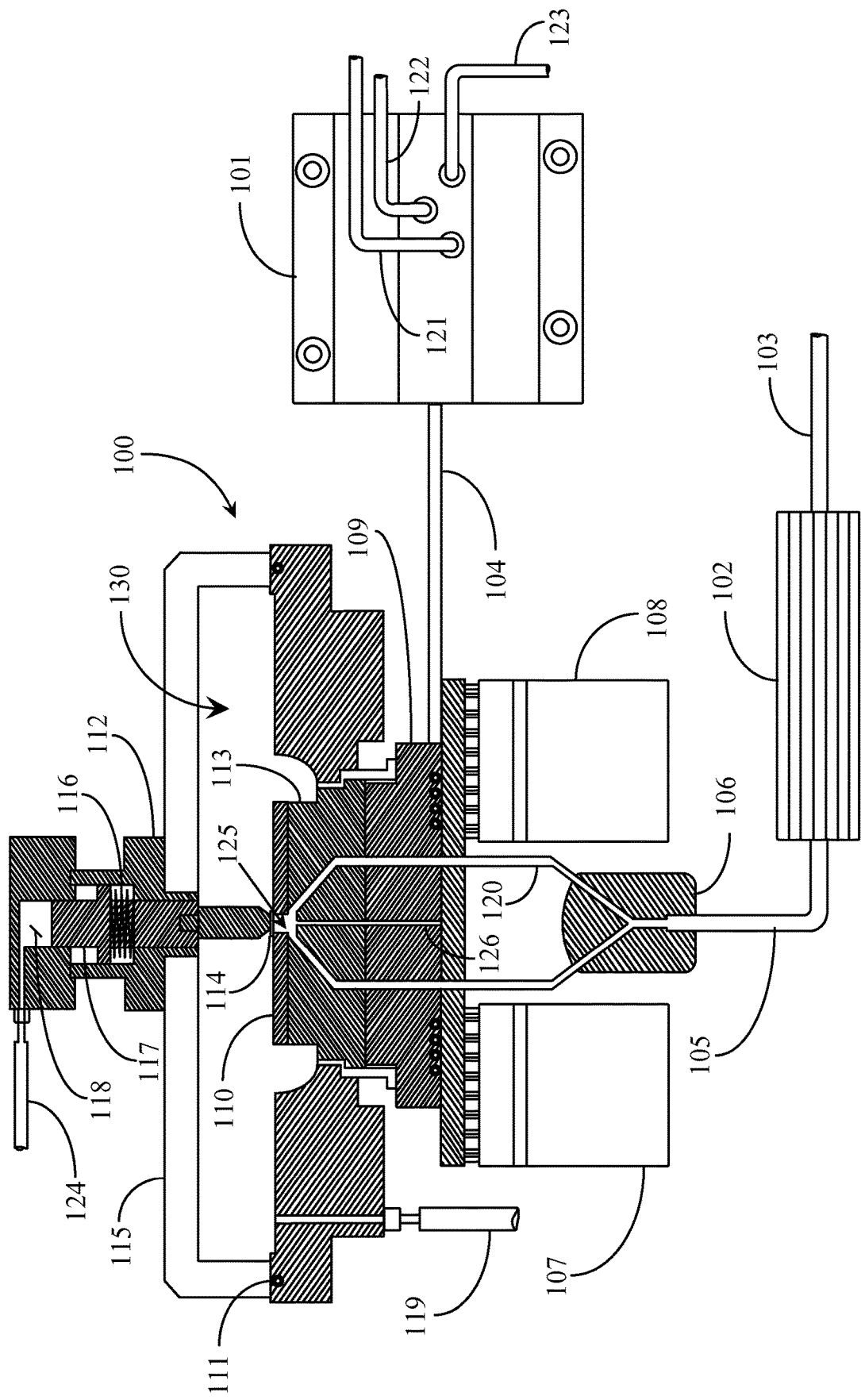
FIG. 1 is a partially sectioned view of an acid etching system available in current art.

FIG. 1 is a sectioned view of an acid etching system 100 available in current art. Etching system 100 is commercially available in the art and to the inventor for use in decapsulating packaged ICs. System 100 has an etch head assembly including an etch plate 113. A removable safety cover 115 may be positioned away from the etch plate via an automated mechanism (not illustrated) to enable placement of an IC device 114 on a gasket 110 placed on etch plate 113. Cover 115 seals to etch plate 113 by an o-ring seal 111 in this example to create a sealed etching chamber.

System 100 includes a ram nose 117 that may be driven against device package 114 by pressure applied to a pressure chamber 118. Ram nose 117 pushes against a ram return spring 116. Under pressure, ram nose 117 securely holds IC package 114 to gasket 110 effectively sealing the IC package to the gasket and the gasket to the etch plate. This operation exposes the underside of IC package 114 in a small region 125 where the area to be stripped may be exposed to the etchant mixture, which is delivered via passage 126 into region 125. Etchant mixture is removed from region 125 via passages 120. Nitrogen is supplied to pressure chamber 118 through a tube 124 connected to an electrically-operated pressure valve (not illustrated) that has connection to the nitrogen source. Chamber 118 may be pressurized and vented via the mentioned valve, which may be operated in automated and timed fashion. Etch head 113 is coupled to a heat exchanger 109.

Conventional system 100 includes an etchant pumping device 101 coupled to heat exchanger 109 via an etchant supply tube 104. Pump device 101 pumps enchant from a supply source (not illustrated) through etchant supply tube 104 and into heat exchanger 109, more particularly through passage 126 into region 125.

The etchant mixture traveling through heat exchanger 109 assumes the temperature of the heat exchanger. The heat exchanger is heated by thermoelectric devices 107 and 108. Electric heaters (not illustrated) may be used to heat the heat exchanger in place of devices 107 and 108. The temperature of the etchant traveling through the heat exchanger is monitored and controlled by an electric control system (not illustrated). An exemplary value for the temperature of the etchant in the exchanger may be lower than ambient temperature such as 10 degrees Celsius (C.). This value may be useful in decapsulating an IC having copper interconnect wires or other copper metalization on the IC surface. The value may also be much higher such as above the boiling point of the etchant up to or about 250 degrees C. in cases of no copper or other sensitive materials in the IC package.

Pump 101 may, under external electric control, select which of supply tubes 121 and 122 may be opened to deliver etchant to the pump. In this way, various ratios of a mix of two etchants may be created or a single etchant may be delivered. Etchant delivery may be rapid and at a high pressure. Therefore mixes are created homogeneously via shear mixing the separately delivered etchants in supply tube 104.

During an etching cycle, the delivered etchant impinges on the IC package 114 creating a turbulent flow that urges used etchant away from the package. The inflow also forces exhaust flow through passages 120 to waste junction head 106. The waste etchants flows are combined into an egress tube 105.

Egress tube 105 connects to a finned heat exchanger 102 that returns heated etchant to ambient temperature. The waste etchant passes through the heat exchanger into an egress tube 103 and into a waste container (not illustrated). A low pressure nitrogen gas delivery apparatus (not illustrated) provides nitrogen gas via passage 119 for purging the volume of the etchant chamber under lid 115 of accumulated etchant materials that may enter via a breach in the seal. The same system is connected to a purge line 123 on pump 101 and can purge etchant from tube 104 and the waste passages in the etch head from accumulated materials. The purging system dispenses nitrogen gas at 1.5 to 2.5 pounds per square inch (PSI).

It is noted herein that the conventional system may be associated with the problems discussed above with reference to the background section of this specification, namely, that the preferred corrosion inhibitor tends to be inactivated by the strong acids used in the decapsulation process making premixing of the inhibitor with the acid impractical.

Figure 2:
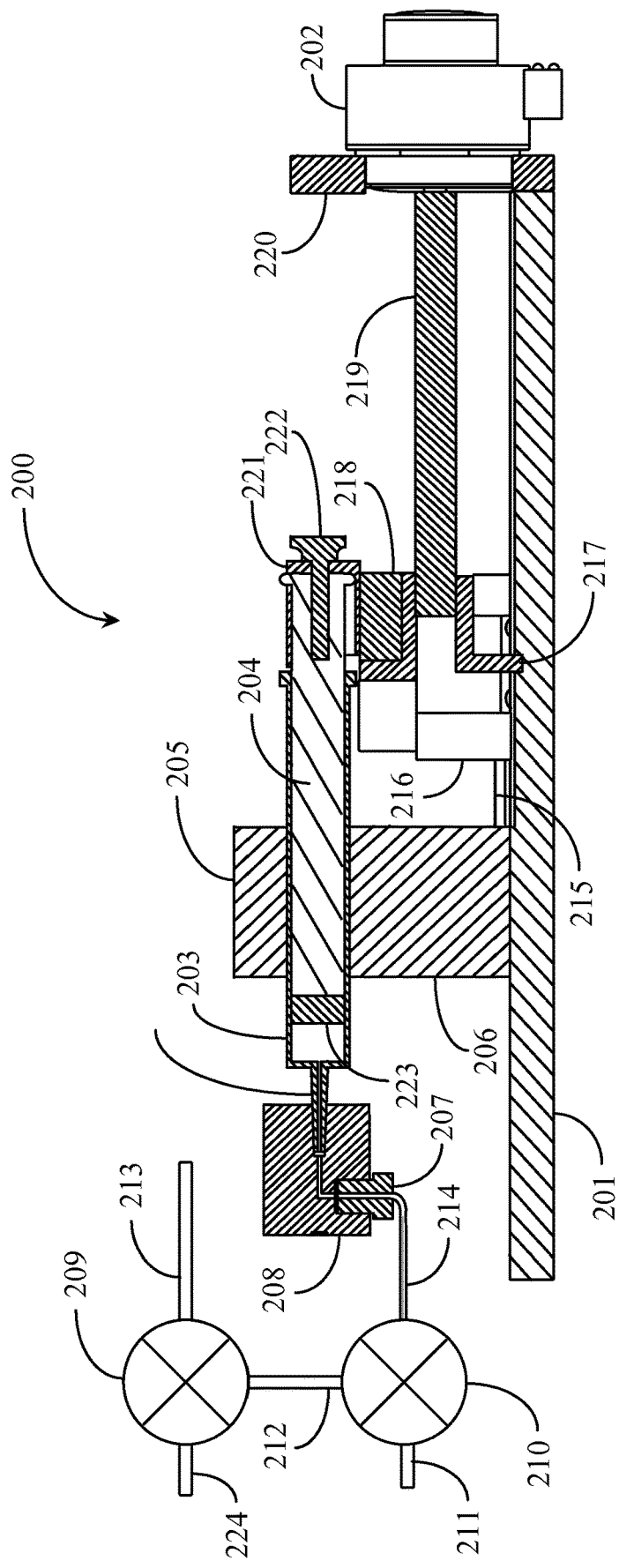
FIG. 2 is a partially sectioned elevation view of a corrosion inhibitor injection mechanism according to an embodiment of the present invention.

FIG. 2 is a partially sectioned elevation view of a corrosion inhibitor injection mechanism 200 according to an embodiment of the present invention. In this embodiment the injection mechanism includes a syringe apparatus 203 for micro-injection of a corrosion inhibitor into an acid stream. In this example syringe 203 is fabricated from a glass tube or barrel and has a plunger 204 in communication with a wiper 223. Syringe 203 may be mounted by clamping or other suitable mounting hardware between a support block 206 and a clamp cover 205. Support block 206 may manufactured of a durable but soft material such as aluminum or another suitable material. Sectioning illustrates the syringe position through the clamp and support structure. Clamp cover 205 may be made of aluminum or some other durable material. There are, of course, other suitable ways of mounting syringe apparatus 203 to a frame.

Syringe 203 has a "Luer" tapered tip 225 that fits into a recess in a syringe end block 208. In this way syringe 203 may communicate content through a tube 214 fitted into a pathway provided through end block 208 from the bottom of the syringe recess to the coupling of tube 214 to the end block. Tube 214 is connected to end block 208 via a tube-mounting nut 207 in this example. Syringe 203 provides dynamic metering of an inhibitor for injection in one embodiment. In one embodiment metering is performed using an optical method to determine volume of liquid within the syringe at any given time.

Delivery tube 214 in this example is connected to a common port of a three-way valve 210. Valve 210 may be electrically operated from a control panel in a preferred embodiment of the invention. Manual operation may also be used to control valve 210. Three-way valve 210 is connected to a second three-way valve 209 via a tube 212. Tube 212 is connected at valve 210 to a normally open port in the valve. Tube 212 may be connected at valve 209 to a common port of the valve. Common port may refer to both valves inline sharing a same pathway from the injection source.

Valve 209 has a normally open port that vents through a tube 224 to ambient air. Valve 209 has a normally closed port that communicates through a tube 213 to a liquid source of corrosion inhibitor (not illustrated). Plunger 204 of syringe 203 may be secured to a plunger clamp 221 via a thumb screw 222. Plunger clamp 221 is fixed or mounted to a carriage 218. Carriage 218 is adapted to ride on a pair of profile rails 215 with the aid of a linear bearings assembly 216. Profile rails 215 are mounted to a rail base plate 201.

In this example, carriage 218 is fixed to a lead screw nut 217 that threads onto and moves or rides on a lead screw 219 that may be controlled by an electric motor 202. Electric motor 202 is mounted to a mounting plate 220 that in turn is fixed to rail plate 201. Support block 206 and valves 210 and 211 are also mounted to or otherwise fixed to rail plate 201. The carriage mechanism may be provided using a variety of components and configurations without departing from the spirit and scope of the present invention.

In operation motor 202 may be activated to turn lead screw 219 causing lead screw nut 217 and attached carriage 218 to travel along the lead screw aided by linear bearing assembly 216 riding on rails 215. Plunger 204 moves within the syringe barrel by virtue of a connection to carriage 218 by virtue of clamp 221 fixed to carriage 218 as described further above. Therefore the plunger may be brought into syringe block 208 and also may be withdrawn via motor control of motor 202. It is noted herein that motor speeds and direction of travel, etc may be controlled remotely via a control station or application in communication with the control station. Such a control station or associated application may also be used to control valves 210 and 209 as well.

Source liquid (inhibitor) may be drawn into syringe 203 by withdrawing the plunger from the syringe barrel. Valve 209 is activated to connect the common port on the valve to the normal open port on valve 210 over tube 212. The common port on valve 210 communicates through tube 214 and syringe end block 208 to the syringe lumen or tip. Plunger 204 may then be partially withdrawn under motor control resulting in liquid source material being drawn into the syringe from the source of the material through tube 213 to valve 209, over tube 212 to valve 210 and over tube 214 and through syringe end block 208.

In order to dispense inhibitor from syringe 203, valve 209 is deactivated and valve 210 is activated. Operation of motor 202 to push plunger 204 back into syringe barrel 203 forces the liquid out of the syringe lumen through the end block and tube 214 through valve 210 and out tube 211 to an injector fitting. Motor 202 may be operated at a high rotational precision. This enables precise control of the amount of liquid dispensed. Source liquid dispensed through tube 211 goes to an injector fitting described further below in this specification.

Figure 3:
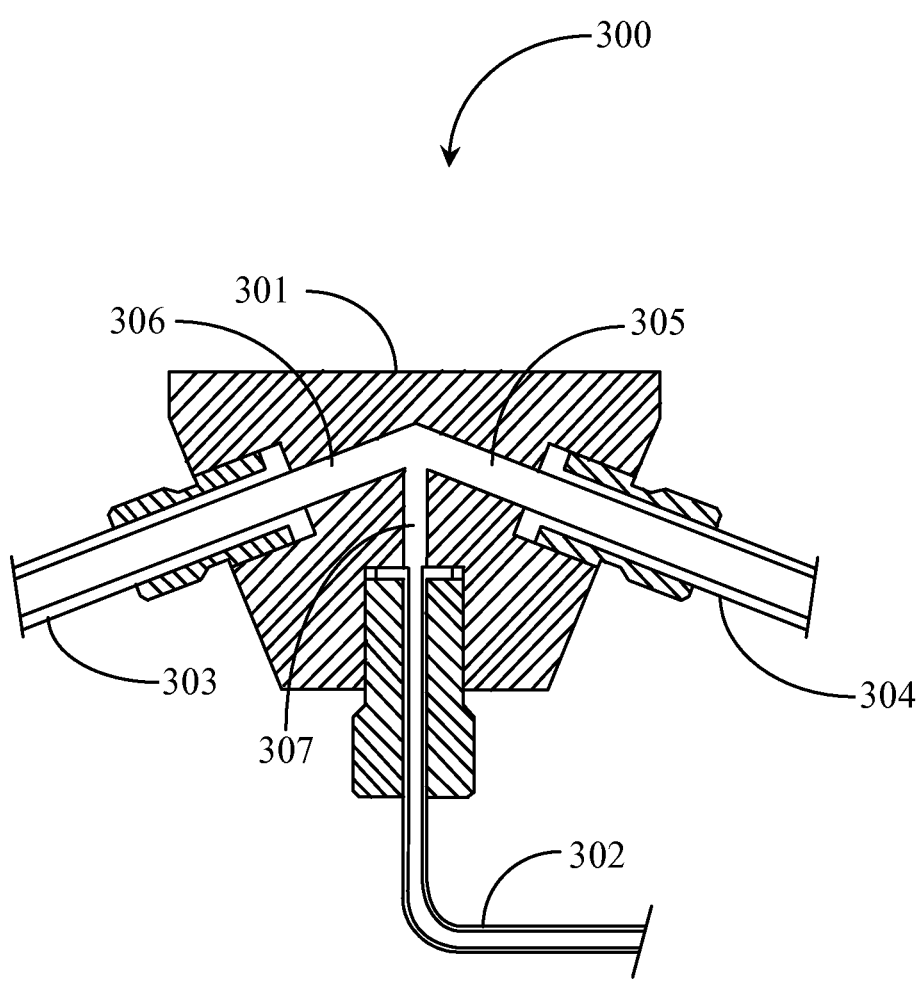
FIG. 3 is a section view of an injector fitting according to an embodiment of the present invention.

FIG. 3 is a sectioned view of an injector fitting 300 according to an embodiment of the present invention. Injector fitting 300 may be installed in an acid etching or decapsulation system such as the system illustrated in FIG. 1. Injector fitting 300 includes a fitting body 301. Body 301 may be manufactured of aluminum or another workable metal or another durable material. Fitting body 301 has a passage 306 and a connected passage 305. Passage 306 supports a fitted tube 303 analogous to tube 104 leading into heat exchanger 109 of FIG. 1. Pathway 305 supports a fitted tube 304 analogous to tube 104 leading to decapsulator pump 101 of FIG. 1.

Fitting 300 includes a third passage 307 serving as an input port for injecting inhibitor solution into an etchant stream. The inhibitor may be injected into the etchant stream through an intersecting pathway 307 via a fitted tube 302 that leads to valve 210 of the injection system of FIG. 2. Passages 306 and 305 meet at an angle of approximately 135 degrees in this embodiment. This angle at the injection point causes the incoming etchant stream from the pump to be more turbulent, resulting from divergence from an otherwise straight path to the heat exchanger. The turbulence created by the angle reduces negative pressure at the junction where the inhibitor is injected into the stream. The reduction may prevent inhibitor from being drawn back out of tube 302. The turbulence may also improve disbursement of the inhibitor by volume into the etchant stream. The angle between the passages is not a limitation in the invention, but a preference in some embodiments.

In this embodiment the inside diameters of pathways 306 and 305 are the same as the inside diameters of tubes 303 and 304. The tubes are fitted to fitting body 301 with fitting nuts as illustrated. In one embodiment the injection pathway 307 is smaller in diameter than the etchant pathways.

Figure 4:
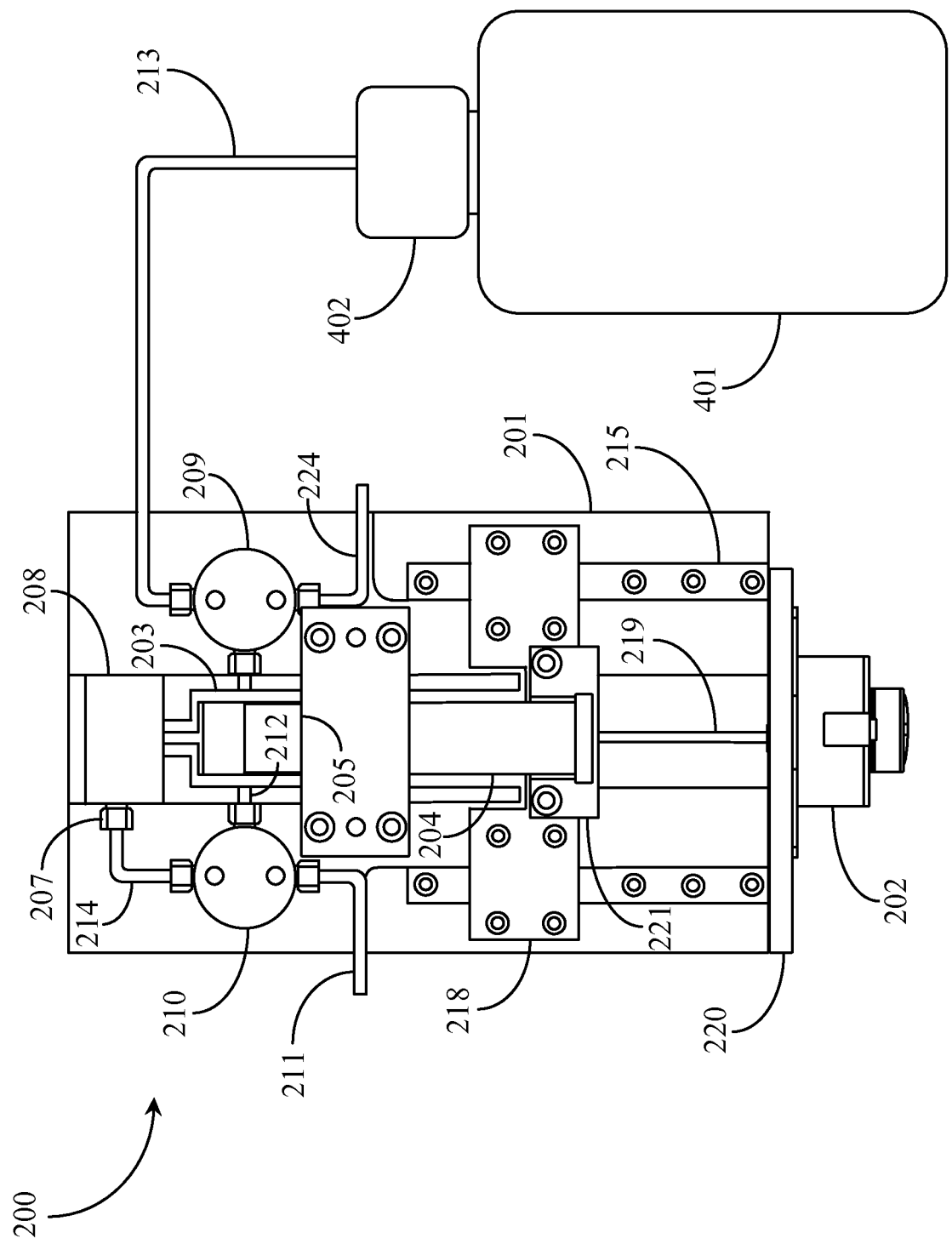
FIG. 4 is an illustration view of the corrosion inhibitor injection mechanism of FIG. 2.

FIG. 4 is a plan view of the corrosion inhibitor injection mechanism of FIG. 2. In this view the arrangement of valves 210 and 209, carriage 218 and rail system 216 can be viewed in symmetry. Carriage 218 rides on parallel rails 215 aided by linear bearings as described further above. Motor 202 controls lead screw 219 to move plunger 204.

Inhibitor solution is drawn from storage bottle 401 having a cap 402 supporting tube 213 leading into valve 209. When solution is being drawn into syringe 203 for example, the plunger 204 is urged all the way into the syringe barrel 203 while valve 209 has open connection to valve 210 over tube 212. Partial withdraw of the plunger within the syringe barrel then causes solution to be drawn into the syringe. Valve 209 may then be closed while valve 210 is opened to tube 211 leading to the fitting of FIG. 3.

Figure 5:
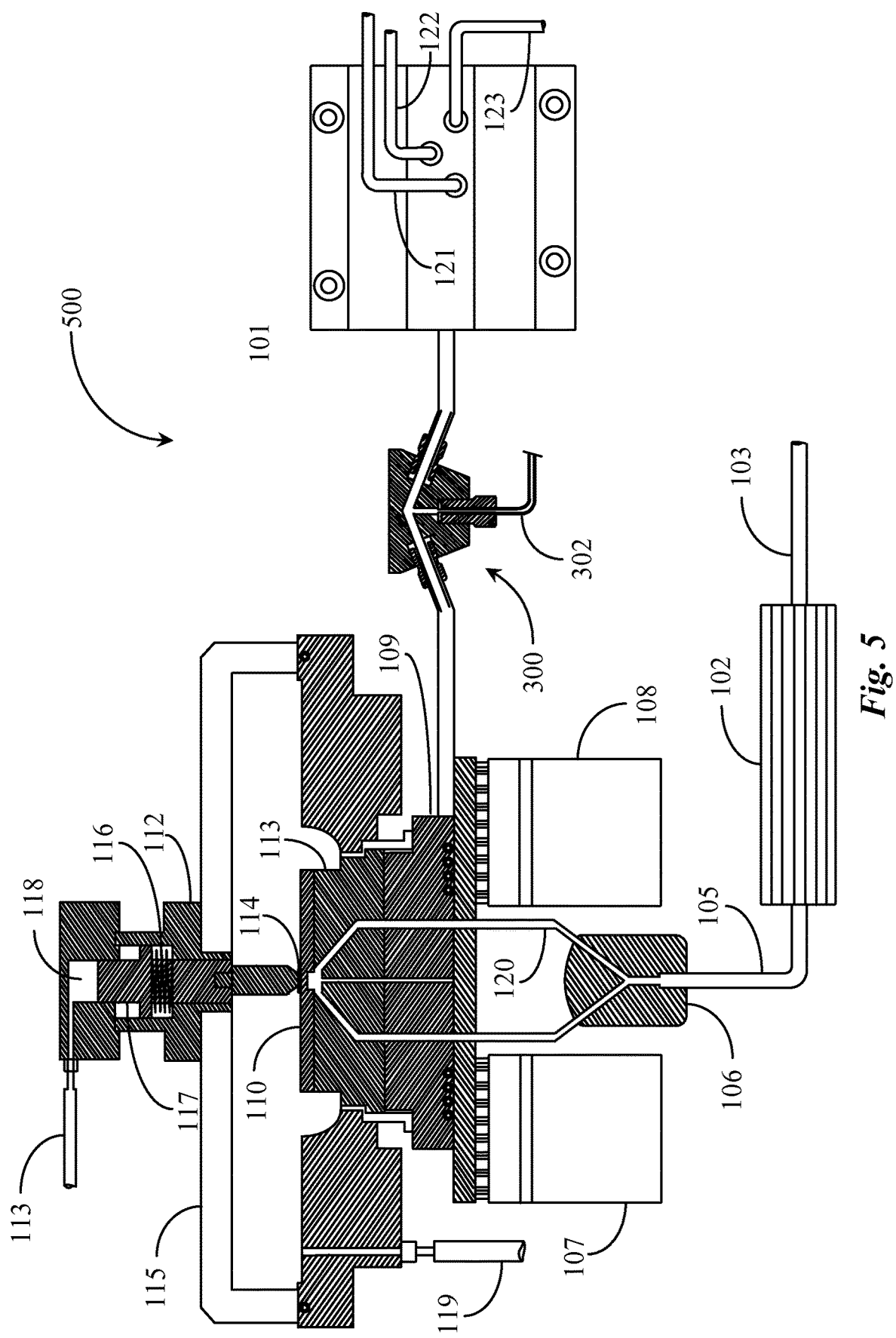
FIG. 5 is a structural view of the corrosion inhibitor injection system coupled to the acid etching system of FIG. 1.

FIG. 5 is a structural view of the corrosion inhibitor injection 300 coupled to the acid etching system of FIG. 1. This figure depicts injector fitting 300 of FIG. 3 installed between decapsulator pump 101 and etching system 100, more particularly the heat exchanger 109 of the system. Corrosion inhibitor is injected into the fitting via the intersecting tube into the etchant stream that is delivered by pump 101. The syringe system of FIG. 2 and FIG. 4 is not shown in FIG. 5, but may be assumed to be connected to injector fitting 300 by passage 302.

In a preferred embodiment timing of injections of small amounts of corrosion inhibitor is synchronized with the timing of etchant delivery to the decapsulator from the etchant pumping system. The injection of the corrosion inhibitor is timed to be just prior to each decapsulator pump delivery. This places a micro-aliquot of inhibitor into the central passage of the injector fitting where it may stay until the next delivery from the decapsulator pump. The time between deliveries may be variable and may be dependent on the decapsulation process order and which part of the decapsulation process is being executed. A microprocessor may be provided to control the motor assisted position of the syringe and may also determine the timing for delivering the corrosion inhibitor. In one embodiment, the microprocessor may receive operating instructions from a control processor on the decapsulator machine. Moreover, the process parameters, injection volumes and timing, may be set by and controlled from the control processor.

In one embodiment of the present invention the injection system includes an idle mode setting putting the system on standby or sleep mode. This might occur when a packaged IC does not require a corrosion inhibitor in the decapsulation process. In one embodiment different corrosion inhibitors might be injected for different devices or for different parts of a same device being decapsulated. The injection system may include a purge cycle in between uses of different corrosion inhibitors. In one embodiment the system might be scaled to enable two inhibitors to be seamlessly swapped in use by adding valves and isolating the two sources via isolated delivery pathways. In one embodiment the quantity of corrosion inhibitor injected is 1/20 to 1/50 the volume of acid dispensed by the decapsulator.

Figure 6:
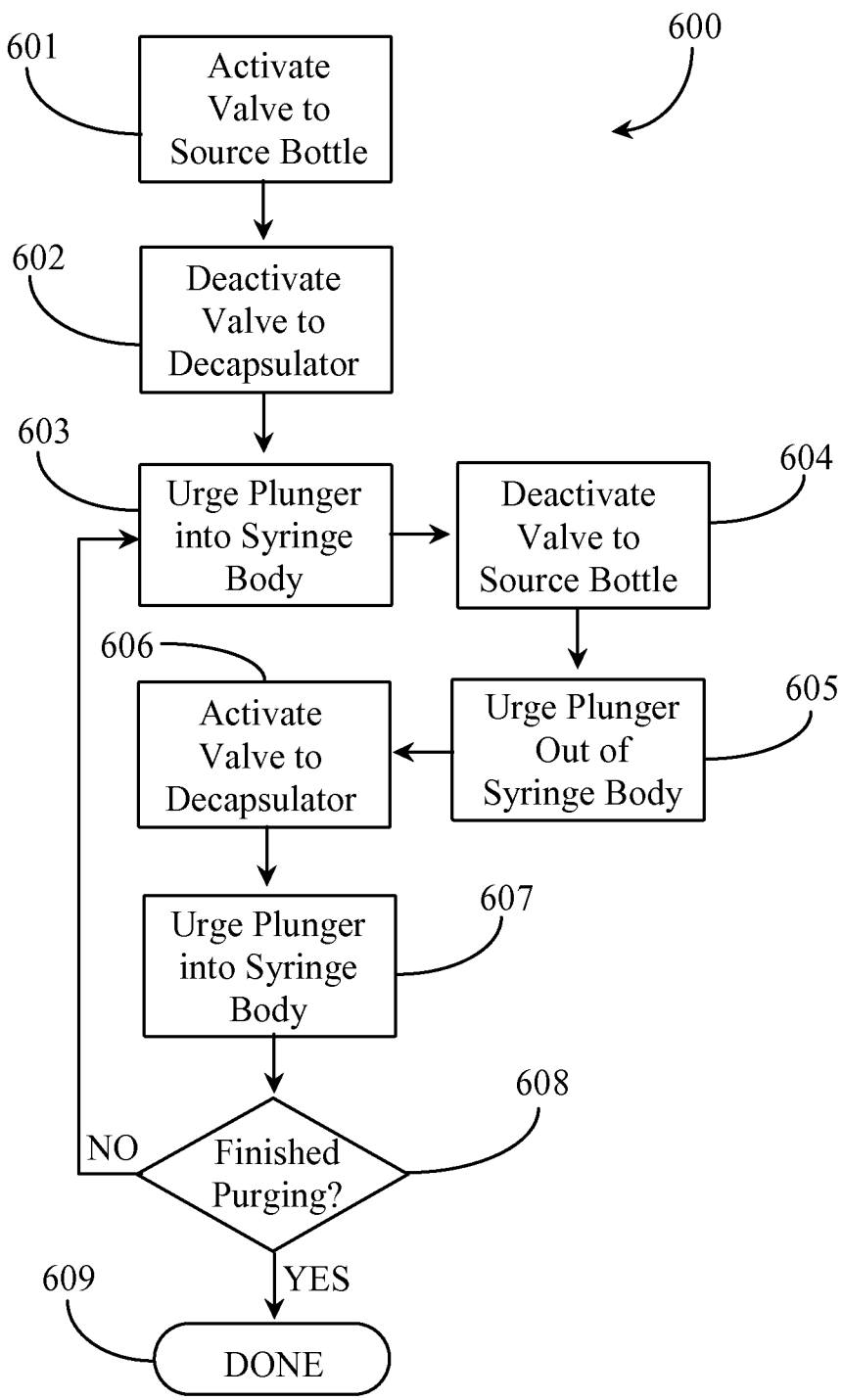
FIG. 6 is a process flow chart 600 depicting a process of purging the injector of FIG. 2.

FIG. 6 is a process flow chart 600 depicting a process of purging the injector of FIG. 2. At step 601, the valve having direct connection with the source of inhibitor (typically a bottle of liquid solution), is activated to open a line between the source inhibitor solution and the syringe. At this step, the common port (line between valves) remains open and the port to ambient air remains closed. At step 602, the valve having direct connection with the decapsulation machine is deactivated closing the port to the machine. At this step the common port is open and the port to the syringe block remains open.

In this discussion, activation of a valve for a specific port is synonymous to adjusting the valve to the correct port setting such that the specified port is open. To deactivate a valve for a specific port means adjusting the valve to the correct port setting that excludes an open state for the specified port. Each valve has three ports and shares one of those ports in common with (direct line between valves).

At step 603, the plunger of the syringe is urged via the motor into the syringe body. This functions to empty inhibitor from the syringe back into the source bottle through the opened line through the syringe block, the valves through common ports, and into the source bottle. At step 604, the valve with direct connection to the source bottle is deactivated. At this juncture in the process both valves are deactivated but a port to ambient air (224, FIG. 4) is left open on the valve that directly communicates with the source bottle. It is noted that the common line between the valves (normal open) remains open as the syringe communicates directly through the syringe block.

At step 605, the plunger is urged out of the syringe body to draw air through the valve port to ambient air mentioned above. The port to ambient air may be immediately closed at full draw of the plunger out of the syringe. At step 606, the valve leading to the decapsulator machine is activated to open a line between the syringe and the decapsulator. In this step the common port is closed. At step 607, the plunger is advanced back into the syringe dispensing the previously drawn air into the line to the decapitator.

It is noted herein that during full dispenses into the decapsulator, the decapsulator machine may be in a state of gas purge where low pressure (1.5-2.5 PSI) nitrogen gas may be blown through the decapsulator pump removing any left over inhibitor from the acid delivery lines to a waste container. Steps 603 through 607 may be repeated until it is determined that a complete purge has been achieved. At step 608 a determination might be made as to whether the purge is complete. Such a determination might be a time-based determination using a standard time period for low pressure purging. In one embodiment the purge may be sensor based wherein a sensor or sensors capable of detecting the inhibitor signature are disbursed at strategic points in the line architecture and report to the control station when an acceptable "purge" reading is registered.

Figure 7:
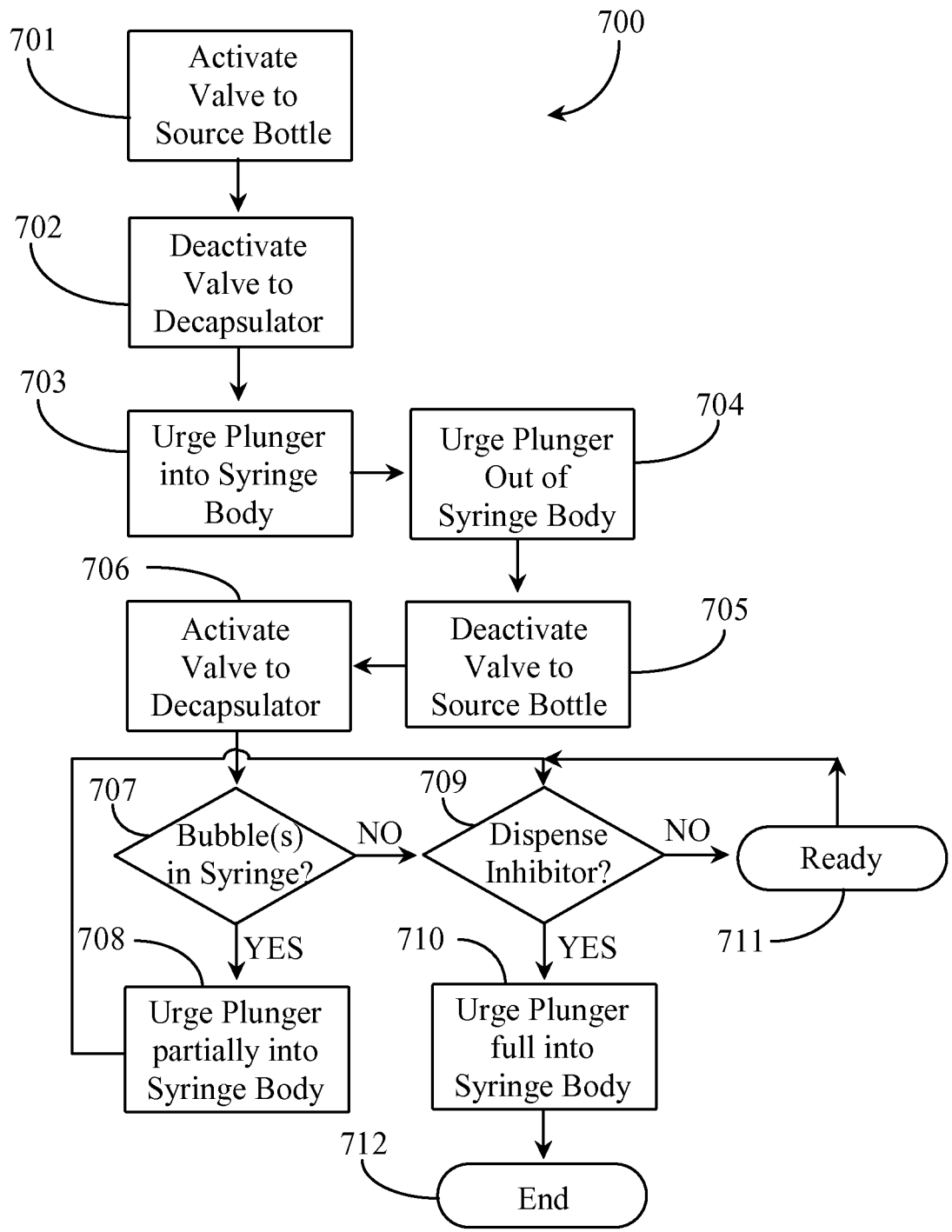
FIG. 7 is a process flow chart 700 depicting a process of filling the injector of FIG. 2 with inhibitor.

FIG. 7 is a process flow chart 700 depicting a process of filling the injector of FIG. 2 with inhibitor. At step 701, the valve directly connected to the inhibitor source bottle is activated to open a line between the syringe and the source bottle. In this step the common ports between valves remain open but the port to ambient air remains closed. At step 702 the valve directly connected with the decapsulator is deactivated meaning the port to the machine is closed while the common port and port to syringe block remains open.

At step 703, the plunger is urged fully into the syringe body dispensing anything in the syringe back into the source bottle. At step 704, the motor reverses to draw the plunger out of the syringe body drawing up liquid inhibitor into the syringe. The active pathway is from the source through the first inline valve, over the common line between valves, into the second inline valve, through the syringe end block pathways, and into the syringe.

At step 705, the valve connected directly to the source bottle is deactivated to close the port to the source bottle. The common port is also closed. At step 706 the valve having direct connection to the decapsulator is activated. In this state the port to the decapsulator is open and the port to the syringe block is open while the common port is closed.

It may be determined at step 707, whether there is a bubble or air pocket in the syringe. This may be determined automatically using an optical detection system. If it is determined that there is a bubble or bubbles of air trapped in the syringe fluid, the process may move to step 708 where the plunger may be urged only partway into the syringe to expel the bubbles. If it is determined that there are no detectable bubbles in the syringe at step 707 then the process may move to step 709 where it might be determined whether to dispense the inhibitor that has been draw into the syringe at step 704.

It is noted herein that the timing of a full dispense of inhibitor into an etchant stream may be synchronized with the etchant pump timing of deliver of the etchant into the decapsulator heat exchanger. In a synchronized manner, the inhibitor is injected just before delivery of the etchant. In this way the corrosion protection begins immediately in the process. In the case of bubbles in the syringe and correction of the issue at step 708, the process moves to step 709 to determine if the injection should occur. Step 709 may be time based such that pulses of inhibitor are injected between pulses of etchant delivered from the decapsulator pump.

If at step 709 it is determined not to dispense inhibitor, the process resolves to a default ready state 711 and loops back when the dispense time arrives. The default ready state may be notified to dispense inhibitor in some cases. In other cases the mechanism is strictly timed and synced with a repetitive etch delivery sequence. It is noted herein that the amounts of etchant delivered compared to the amount of inhibitor may depend in part on the type of metal being protected.

Adjustment controls for fine tuning inhibitor to etchant ratios may be provided at a control station or application driving and controlling the process. If it is determined to dispense the inhibitor at step 709, the process moves to step 710 where the plunger is urged fully into the syringe forcing the inhibitor through the syringe block and into the valve directly connected to the decapsulator and out of the port to the decapsulation machine. The steps may be repeated for as many injections as might be required. In one aspect there may be one injection of inhibitor for every two deliveries of etchant. In another aspect there might be more than one separate delivery of inhibitor between deliveries of etchant. In one aspect two separate inhibitors may be used in the process of decapsulating one IC package. In this case the inhibitors may be injected in the same fashion described above alternating inhibitors between injections, for example.

Figure 8:
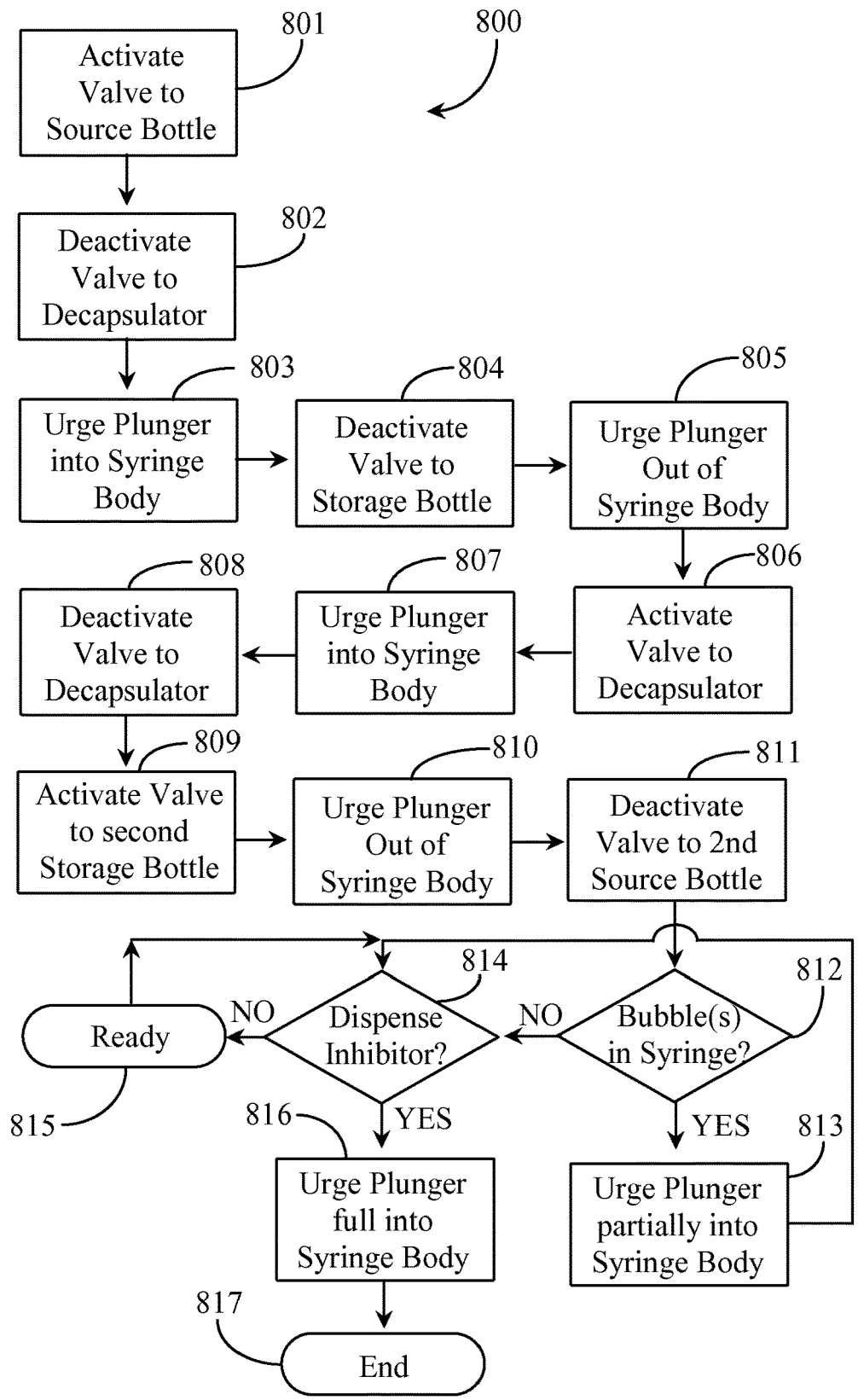
FIG. 8 is a process flow chart 800 depicting a process of changing the inhibitor source to dispense a different inhibitor.

FIG. 8 is a process flow chart 800 depicting a process of changing the inhibitor source to dispense a different inhibitor. At step 801, the valve directly connected to a first inhibitor source bottle is activated meaning an open port to the inhibitor, an open common port, and a closed port to air. At step 802 the valve to the decapsulator is deactivated meaning a closed port to the decapsulator machine, an open common port and an open port to the syringe end block. At step 803 the plunger is urged fully into the syringe barrel emptying any contents in the syringe back into the source bottle.

At step 804 the valve connected to the storage bottle is deactivated meaning the port to the source bottle as well as the common port is closed. A port to ambient air is open. At step 805, the plunger is urged from the syringe body drawing air into the syringe through the ambient air port. The ambient air port my be closed immediately after draw.

At step 806, the valve having direct connection to the decapsulator is activated meaning an open port to the decapsulator machine, a closed common port, and an open port to the syringe block. At step 807 the plunger is urged fully into the syringe barrel forcing the air out through the syringe end block through the valve port to the decapsulator line. After purge, the valve to the decapsulator is deactivated meaning that the port to the decapsulator line is closed at step 808.

It may be assumed in one aspect that there may be an additional valve for connecting to a second inhibitor source bottle. In one aspect, the first inhibitor source bottle is removed and a second source bottle is substituted therefor. In another aspect a single valve is connected to the first and second inhibitor source bottles and is modified to accommodate a required number of ports to communicate in an isolative manner with both the first and second sources of inhibitor.

At step 809, a valve to the second inhibitor storage bottle is activated. At step 810 the plunger is drawn out taking up the second inhibitor. At step 811 the valve connected to the second inhibitor storage bottle is deactivated. The remaining steps may be similar or the same as steps 707 through 712 of the process of FIG. 7. At step 812 the process may deal with possible bubbles in the solution trapped in the syringe. At step 813, the plunger may be partially urged into the syringe barrel to correct the bubble issue should it be detected at step 812. At step 814, a determination may be made whether to dispense the second inhibitor. If the determination is not to dispense, then the process may move to a ready state 815. If it is determined to dispense the inhibitor, the plunger is brought fully into the syringe barrel at step 816. The process may then end at step 817.

In one embodiment the decapsulation process, including the method for injecting the corrosion inhibitor into the etchant stream, is controlled by the process controller of the decapsulation system with added electrical wiring to the motor controlling injection. A software application executing from a non-transitory medium on the decapsulation system processor may provide the process instruction and process variations required to completely decapsulate a device while protecting specific metallic components from corrosion by the acid. Refill, fill, and clear system functions may be provided by the control software or software application.

It will be apparent to one with skill in the art that the corrosion inhibitor injection control system of the invention may be provided using some or all of the mentioned features and components without departing from the spirit and scope of the present invention. It will also be apparent to the skilled artisan that the embodiments described above are specific examples of a single broader invention that may have greater scope than any of the singular descriptions taught. There may be many alterations made in the descriptions without departing from the spirit and scope of the present invention.

It will be apparent to the skilled person that the arrangement of elements and functionality for the invention is described in different embodiments in which each is exemplary of an implementation of the invention. These exemplary descriptions do not preclude other implementations and use cases not described in detail. The elements and functions may vary, as there are a variety of ways the hardware may be implemented and in which the software may be provided within the scope of the invention. The invention is limited only by the breadth of the claims below.

The invention claimed is:

1. An inhibitor solution injector system for an IC decapsulation apparatus, comprising:
    a first source reservoir containing inhibitor solution;
    a second source reservoir containing etchant solution;
    an injection coupling having an etchant input passage intersecting at an angle approximately 135 degrees with an etchant output passage, and an inhibitor input passage joining the etchant passages at the intersection of the etchant input passage and the etchant output passage;
    an etchant pump coupled to the second source reservoir, pumping etchant to the etchant input passage and through the etchant output passage;
    an inhibitor injection apparatus comprising a motor-driven syringe coupled to the first source reservoir and to the inhibitor input passage; and
    control circuitry controlling the motor-driven syringe of the fluid injection apparatus;
    wherein the etchant pump urges etchant from the second source reservoir through the etchant input and output passages, and the motor-driven syringe of the inhibitor injection apparatus draws inhibitor from the first source reservoir, and the control circuitry controls the motor-driven syringe to inject the inhibitor into the etchant passages at the point of intersection of the etchant input passage and the etchant output passage, the acute change in direction in the etchant passages causing turbulence enhancing efficiency of mixing the etchant and the inhibitor.

2. The injector system of claim 1 wherein the fluid injection apparatus is controlled to inject inhibitor solution at one or more of specific times, in specific quantity or at specific rate, coordinated with measured flow of etchant solution through the through passage.

3. The injector system of claim 2 wherein the fluid injection apparatus is controlled to inject a specific quantity of inhibitor solution into the through passage at a time when there is no flow of etchant solution through the through passage.

4. The injector system of claim 1 wherein the translator mechanism is driven by a coupled electric motor controlled by the control circuitry.

5. The injector system of claim 1 wherein the control circuitry further comprises a processor executing software following preprogrammed control data.

6. The injector system of claim 1 wherein the injection coupling through passage comprises a first bore intersecting a second bore at an obtuse angle, and the input passage intersects the through passage at the intersection of the first bore and the second bore, the input passage forming an equal acute angle with each of the first and the second bores.

7. The injector system of claim 6 wherein the first and the second bore are of a common diameter, and the input passage has a diameter substantially smaller than the bores of the through passage.

\* \* \* \* \*